United States Patent [19]
Li et al.

[11] Patent Number: 6,009,033
[45] Date of Patent: Dec. 28, 1999

[54] METHOD OF PROGRAMMING AND ERASING AN EEPROM DEVICE UNDER AN ELEVATED TEMPERATURE AND APPARATUS THEREOF

[75] Inventors: Xiao-Yu Li; Sunil D. Mehta, both of San Jose, Calif.

[73] Assignee: Advanced Micro Devices, Inc., Sunnyvale, Calif.

[21] Appl. No.: 09/198,653

[22] Filed: Nov. 24, 1998

[51] Int. Cl.⁶ ............................ G11C 7/04; G11C 16/06
[52] U.S. Cl. .......................... 365/212; 365/211; 365/51; 365/185.09; 365/185.29; 365/185.33
[58] Field of Search .................. 365/185.09, 185.24, 365/185.29, 51, 211, 212, 185.33

[56] References Cited

U.S. PATENT DOCUMENTS

| | | | |
|---|---|---|---|
| 5,623,594 | 4/1997 | Swamy | 395/180 |
| 5,875,142 | 2/1999 | Chevallier | 365/212 |
| 5,926,386 | 7/1999 | Ott et al. | 364/175 |
| 5,933,365 | 8/1999 | Klersy et al. | 365/148 |

*Primary Examiner*—Andrew Q. Tran
*Attorney, Agent, or Firm*—Brinks Hofer Gilson & Lione

[57] ABSTRACT

A semiconductor device having an EEPROM array includes resistive elements capable of elevating the temperature of the EEPROM array during programming and erasing operations. The resistive elements are located in close proximity to individual EEPROM cells within an EEPROM array. By elevating the temperature of the EEPROM cell during programming and erasing operations, data errors associated with shifting threshold voltages of floating-gate devices within the EEPROM is reduced. An operating method for improving the long term reliability of an EEPROM device includes the step of providing thermal energy during programming and erasing sufficient to raise the temperature of the EEPROM device to at least about 70° C.

20 Claims, 2 Drawing Sheets

METHOD OF PROGRAMMING AND ERASING AN EEPROM DEVICE UNDER AN ELEVATED TEMPERATURE AND APPARATUS THEREOF

FIELD OF THE INVENTION

This invention relates, in general, to non-volatile memory devices and to methods for programming and erasing the devices, and more particularly, to EEPROM devices and methods for programming and erasing EEPROM device.

BACKGROUND OF THE INVENTION

State of the art non-volatile memory devices are typically constructed by fabricating a floating-gate transistor in a silicon substrate. The floating-gate transistor is capable of storing electrical charge either on a separate gate electrode, known as a floating-gate, or in a dielectric layer underlying a control gate electrode. Data is stored in a non-volatile memory device by changing the threshold voltage of the floating-gate transistor through the storage of electrical charge in the floating-gate. For example, in an n-channel EEPROM (electrically-erasable-programmable-read-only-memory) device, an accumulation of electrons in a floating-gate electrode creates a high threshold voltage in the floating-gate transistor. When the control gate is grounded, current will not flow through the floating-gate transistor, which is defined as a logic 0 state. Conversely, a reduction in the negative charge in the floating-gate electrode creates a low threshold voltage. In this condition, with the control gate grounded, current will flow through the floating-gate transistor, which is defined as a logic 1 state.

For example, one particular type of non-volatile memory device is the flash EEPROM. Flash EEPROMs are a type of device that provide electrical erasing capability. The term "flash" refers to the ability to erase the memory cells simultaneously with electrical pulses. In an erase state, the threshold voltage of the floating-gate transistor is low, and electrical current can flow through the transistor, indicating a logic 0 state.

In a flash EEPROM device, electrons are transferred to the floating-gate electrode through a thin dielectric layer, known as a tunnel-oxide layer, located between the floating-gate electrode and the underlying substrate. Typically, the electron transfer is carried out either by hot electron injection, or by Fowler-Nordheim tunneling. In either electron transfer mechanism, a voltage is coupled to the floating-gate electrode by a control-gate electrode. The control-gate electrode is capacitively coupled to the floating-gate electrode, such that a voltage applied to the control-gate electrode is coupled to the floating-gate electrode. In one type of device, the control-gate electrode is a polycrystalline silicon gate electrode overlying the floating-gate electrode, and separated therefrom by a dielectric layer. In another type of device, the floating-gate electrode is a doped region in the semiconductor substrate.

The flash EEPROM device is programmed by applying a high positive voltage to the control-gate electrode, and a lower positive voltage to the drain region of the floating-gate transistor. These applied potentials transfer electrons from the substrate through the tunnel oxide layer and to the floating-gate electrode. Conversely, the EEPROM device is erased by grounding the control-gate electrode, and applying a high positive voltage to either the source or drain region of the floating-gate transistor. Under erase voltage conditions, electrons are removed from the floating-gate electrode and enter either source or drain regions in the semiconductor substrate.

Another type of EEPROM device is extensively used in programmable logic devices (PLDs). EEPROM cells formed in PLDs include three transistors: a write transistor, a read transistor, and a sense transistor. In conventional EEPROM cells, the control gates of the write transistor and read transistor are connected to the same wordline. Also, in PLD EEPROM cells, the read transistor and the sense transistor are connected to the same bitline. When the read transistor is turned on, the common bitline connection permits the sense transistor to be effectively used as the storage cell of the EEPROM.

In operation, to program PLD EEPROMs, a high voltage (between 13 and 15 volts) is applied to the wordline of the EEPROM cell. A relatively high voltage (approximately 11 to 12 volts) is applied to the control gate of the write transistor, allowing voltage applied on the bitline to be transferred to the control gate of the sense transistor. The application of such high voltage levels is a write condition that results in data being stored in the EEPROM cell.

To erase the EEPROM cell, a voltage $V_{cc}$ is applied to the wordline of the write transistor, which also causes the read transistor to turn on. Ground potential is applied to the bitline, which is connected to the drain of the read transistor. A high voltage (between 13 to 15 volts) is applied on the capacitor coupled control gate (ACG). Under this bias condition, the high voltage applied to ACG is coupled to the floating-gate of the sense transistor and the EEPROM cell is erased by the transfer of electrons through the tunnel oxide layer from the floating-gate to the substrate.

Over time, both types of EEPROM devices will be written and erased repeatedly as data is stored and removed from the device. Since the EEPROM relies on charge exchange between the substrate and the floating-gate electrode, considerable stress is placed on the tunnel oxide layer underlying the floating-gate electrode. The charge-induced stress in the tunnel oxide layer can cause charge trapping sites to form within the tunnel oxide. The formation of these charge trapping sites is undesirable, because, once formed, electrical current can leak through the tunnel oxide layer from the floating-gate electrode to the substrate. When charge leaks off the floating-gate electrode, a data error occurs in the EEPROM device. In addition to causing charge to leak from the floating-gate electrode, the accumulation of charge in the trapping sites causes the threshold voltage of the floating-gate transistor to shift away from the originally designed threshold voltage. In an n-channel device, the accumulation of charge in the trapping sites causes the threshold voltage to shift to more negative values. Once the threshold voltage shifts away from the designed value, the floating-gate transistor cannot be turned on by application of a typical read voltage applied to the floating-gate electrode. When this happens, a read error occurs and an incorrect logic signal is transmitted from the EEPROM memory cell.

Both charge leakage and threshold voltage instability produce data errors during operation of the EEPROM device. Depending upon the particular function performed by the EEPROM device, the data error can cause catastrophic failure in an electronic system relying upon the EEPROM device. Accordingly, an improved EEPROM device and operating method is necessary to provide a high-reliability EEPROM device that exhibits stable threshold voltage values.

SUMMARY OF THE INVENTION

In practicing the present invention there is provided an EEPROM device that includes a plurality of EEPROM cells.

Each cell includes a write transistor, a read transistor, and a sense transistor. In order to provide enhanced long-term reliability, the formation of trapping sites in the tunnel oxide layer of the EEPROM cells is reduced by programming and erasing the EEPROM device at an elevated temperature that is greater than typical ambient room temperatures. In one embodiment, means is provided within the EEPROM device for elevating the temperature of the EEPROM cells. In this embodiment, the heating means are located in close proximity to each of the plurality of EEPROM cells during programming and erasing. The thermal energy generated by the heating means are sufficient to increase the temperature of each of the plurality of EEPROM cells during a programming and erasing operations.

An EEPROM device in accordance with the invention can include a variety of heat-generating structures capable of elevating the temperature of the EEPROM cells during programming and erasing. In one form, the means for heating is a resistive element in a peripheral region adjacent to each EEPROM cell. In other forms, the means for heating can be a polycrystalline silicon resistor, a doped region in the semiconductor substrate, and equivalent structures capable of elevating the temperature of the EEPROM memory cells.

In another embodiment of the invention, a method for programming and erasing a semiconductor device having an EEPROM array is provided. Programming leads are electrically coupled to input and output connections on an EEPROM device, and the temperature of the surrounding atmosphere is raised in order to elevate the temperature of the EEPROM array within the semiconductor device. The device is programmed, while thermal energy is generated, such that the temperature of the EEPROM array is increased above the temperature of the surrounding ambient. In operation, it is common to erase the EEPROM cells prior to programming. The beneficial thermal effects of the present invention are also realized during erasing operations.

The temperature elevation of the EEPROM device during programming and erasing can be accomplished by many different thermal sources. For example, in addition to in-situ heating by thermal elements within the device, thermal heating can be by means of thermal convection, and thermal radiation. Thermal convection can be applied by heating the air surrounding the EEPROM device during programming and erasing operations with a conventional convection heating device. Additionally, thermal heating can be by radiative means from a radiation heating device, such as a lamp, and the like. Regardless of the particular heating means employed, the enhanced reliability benefits of the invention are attained by elevating the temperature of the EEPROM array during programming and erasing to a temperature of at least about 70° C.

By programming and erasing an EEPROM device at an elevated temperature of at least about 70° C., the threshold voltage of the floating-gate transistors exhibit stable values over time. Thus, high-reliability EEPROM devices are provided through both an improved EEPROM device, and by an improved operating method.

DETAILED DESCRIPTION OF THE PREFERRED EMBODIMENTS

Figure 1:
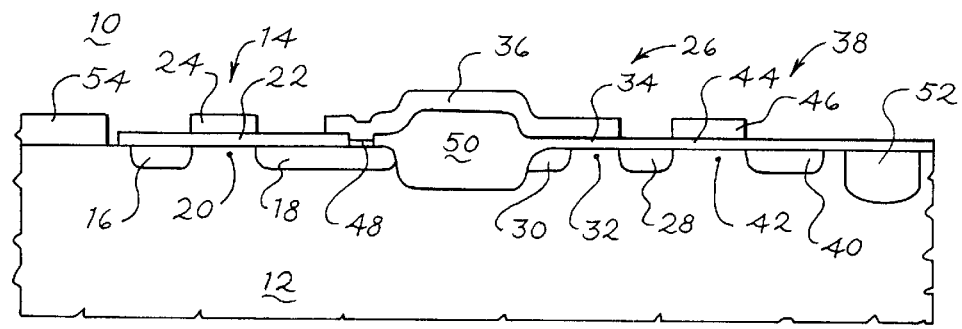
FIG. 1, illustrates, in cross-section, an EEPROM cell formed in accordance with the invention.

Shown in FIG. 1, in cross-section, is an EEPROM cell formed in accordance with a preferred embodiment of the invention. For purposes of illustration, the invention will be described in the context of an n-channel device. However, those skilled in the art will appreciate that the EEPROM cell of the invention can also be fabricated as a p-type device, in which the conductivity type of the substrate and doped regions is reversed to that of an n-type device. EEPROM cell 10 is formed on a p-type semiconductor substrate 12. EEPROM cell 10 includes three MOS transistors, which make up a single-polycrystalline silicon EEPROM memory cell.

Although the preferred embodiment of the invention will be illustrated as a single-polycrystalline silicon EEPROM cell, the advantages of the present invention can be fully realized with a different kind of EEPROM memory cell, such as a double-polycrystalline silicon EEPROM cell, or a triple-polycrystalline silicon memory cell, or the like. In the preferred embodiment, a write transistor 14 includes a drain region 16, a source region 18, a channel region 20, a gate oxide layer 22, and a gate electrode 24. A sense transistor 26 includes a drain region 28, a source region 30, a channel region 32, a gate oxide layer 34, and a floating-gate electrode 36. A read transistor 38 includes a drain region 40, a source region 28 (also the drain region of sense transistor 26), a channel region 42, a gate oxide layer 44, and a gate electrode 46.

Floating gate electrode 36 is capacitively coupled to source region 30 of sense transistor 26, via gate oxide layer 34. Floating-gate electrode 36 is also capacitively coupled to source region 18 of write transistor 14 via a tunnel oxide layer 48. Floating-gate electrode 36 also extends over channel region 32 of sense transistor 26, so that when a sufficient positive charge is placed on floating-gate electrode 36, channel region 32 will invert and conduct current between source region 30 and drain region 28 of sense transistor 26. A field oxide layer 50 insulates floating-gate electrode 36 from underlying semiconductor substrate 12. Additionally, field oxide layer 50 electrically isolates sense transistor 26 from write transistor 14.

In operation, when EEPROM cell 10 is programmed, a positive charge is placed on floating-gate electrode 36 by removing electrons from the floating-gate electrode. To accomplish this, a high programming voltage $V_{pp}$ is applied to gate electrode 46 of read transistor 38, and to gate electrode 24 of write transistor 14. By turning on write transistor 14, a write signal applied to drain region 16 of write transistor 20 is coupled to source region 18 of write transistor 14. Similarly, when read transistor 38 is on, a read signal applied to drain region 40 of read transistor 38 is coupled to source region 28 of read transistor 38.

In order to complete programming of EEPROM cell 10, the high programming voltage $V_{pp}$ is applied to drain region 16 of write transistor 14, and to source region 30 of sense transistor 26. The programming voltage $V_{pp}$ is also applied to drain region 40 of read transistor 38, while semiconductor substrate 12 is held at ground potential. Since source region 18 of write transistor 14 is at a high voltage and source region 30 of sense transistor 26 is at ground, voltage is capacitively coupled to floating-gate 36 due to the electric field created between source region 18 and source region 30 through gate oxide layer 34 and tunnel oxide layer 48. Since the capacitance between source region 18 and floating-gate electrode 36 across tunnel oxide layer 48 is very small, and since the capacitance between source region 30 and floating-gate electrode 36 across gate-oxide layer 34 is substantially greater, a large percentage of the voltage difference between source region 18 and source region 30 appears across tunnel oxide layer 48. This voltage is sufficient because electrons to tunnel from floating-gate electrode 36 to source region 18 of write transistor 14 through tunnel oxide layer 48. The tunneling of electrons from floating-gate 36 creates a net positive charge on floating-gate electrode 36. The positive charge is sufficient to turn on sense transistor 26, because floating-gate electrode 36 extends over channel region 32 of sense transistor 26. This indicates a logical 1, since current can flow through sense transistor 26 during a read operation.

To erase EEPROM cell 10, an erase $V_{cc}$ is applied to gate electrode 24 of right transistor 14. Because of the common wordline connection, the voltage $V_{cc}$ is also applied to gate electrode 46 of read transistor 38. Ground potential is applied to drain region 40 of read transistor 38. Additionally, about 13 to 15 volts is applied to source region 30, which is capacitively coupled to floating-gate electrode 36 through gate oxide layer 34. Under the applied voltage conditions, electrons on floating-gate 36 tunnel through tunnel oxide layer 48 and into source region 18.

In accordance with one embodiment of the invention, heating elements are formed in close proximity to EEPROM cell 10. The heating elements provide thermal energy to semiconductor substrate 12 sufficient to elevate the temperature of EEPROM cell 10 during programming and erasing operations. In one form, a heating element is provided by placing a substrate resistor 52 in semiconductor substrate 12. Substrate resistor 52 is formed by introducing a conductivity-type dopant into semiconductor substrate 12 to form a doped region having a desired resistivity. When electrical current is forced through substrate resistor 52, thermal energy is generated within semiconductor substrate 12 and is conducted by semiconductor substrate 12 to EEPROM cell 10. Preferably, substrate resistor 52 is formed by ion implantation of a conductivity-determining dopant to form an implanted resistor. Alternatively, substrate resistor 52 can be formed by diffusing a conductivity-determining dopants into semiconductor substrate 10 by thermal diffusion.

In an alternative embodiment of the invention, a block resistor 54 is formed on the surface of semiconductor substrate 12. Block resistor 54 can be formed by chemical vapor deposition of polycrystalline silicon, followed by photolithographic patterning and etching. Block resistor 54 can be intrinsic polycrystalline silicon, or polycrystalline silicon doped with a conductivity-determining dopant to obtain a desired electrical resistivity. When electrical current is forced through block resistor 54, thermal energy is imparted to semiconductor substrate 12 and is conducted through the substrate to EEPROM cell 10.

In accordance with the invention, the resistive elements formed in an EEPROM device, such as substrate resistor 52 and block resistor 54, can be arranged relative to EEPROM cell 10 in any one a number of different configurations. The only limitation on the relative location of the resistive elements is that they be capable of elevating the temperature of EEPROM cell 10 to a temperature of at least about 70° C. Accordingly, there can be any number of resistive elements positioned in proximity to the EEPROM cells within an EEPROM device.

Figure 2:
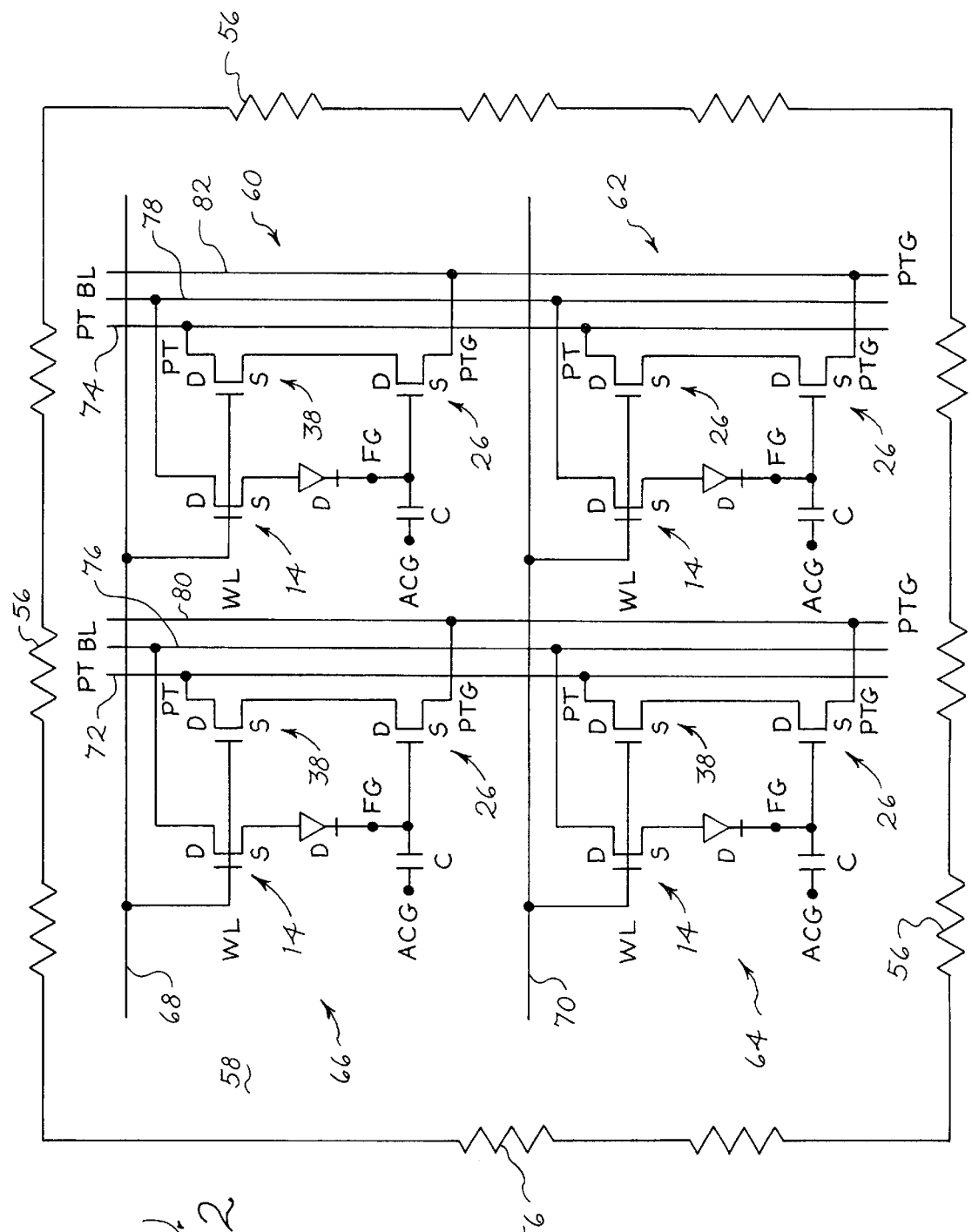
FIG. 2, illustrates, a schematic circuit diagram of an EEPROM array formed in accordance with the invention.

In one embodiment of the invention, a plurality of resistive elements 56 are positioned around the periphery of an EEPROM array, as illustrated in FIG. 2. An EEPROM array 58 includes four EEPROM cells 60, 62, 64 and 66. Each EEPROM cell within EEPROM array 58 is structured similar to EEPROM cell 10 shown in FIG. 1. Each cell includes write transistor 14, sense transistor 26, and read transistor 38. A word line 68 electrically couples the gate electrodes of write transistors 14 and read transistors 38 of EEPROM cells 60 and 66. Correspondingly, a word line 70 electrically couples the gates of write transistors 14 and read transistors 38 in EEPROM cells 62 and 64. A product term line (PT) 72 electrically couples the drain regions of read transistors 38 and EEPROM cells 64 and 66. Correspondingly, a product term line 74 electrically couples the drain regions of read transistors 38 and EEPROM cells 60 and 62. A bit line 76 electrically couples the drain regions of write transistors 14 and EEPROM cells 64 and 66. Correspondingly, a bit line 78 electrically couples write transistors 14 of EEPROM cells 60 and 62. A product term ground line (PTG) 80 electrically couples the source regions of sense transistors 26 and EEPROM cells 64 and 66. Correspondingly, a product term line 82 electrically couples the source regions of sense transistors 26 and EEPROM cells 60 and 62. Further, each of the EEPROM cells include a capacitively coupled control gate (ACG), a floating-gate (FG), and a diode (D). It is important to note that all of the capacitively coupled control gates are connected to the same node. Accordingly, every individual EEPROM cell does not have its own control gate.

Those skilled in the art will recognize the array illustrated in FIG. 2 as an EEPROM array suitable for use in a program logic device (PLD). Although the invention is illustrated in the context of PLD, those skilled in the art will appreciate that the present invention can be fully utilized in other types of semiconductor devices, such as microprocessor devices and microcontroller devices containing EEPROM arrays, and the like. Additionally, although resistive elements 56 are illustrated in a peripheral relationship to EEPROM memory array 58, other geometric relationships are possible. For example, resistive elements 56 can encircle EEPROM array 58, or form a triangular geometry with respect to EEPROM array 58, or the like. Further, the resistive elements can be interspersed with EEPROM array 58 and occupy positions intermediate to the individual EEPROM cells.

The embodiment of the invention shown in FIGS. 1 and 2 illustrates an in-situ method for providing thermal energy to an EEPROM array during a programming and erasing operations. In the in-situ embodiment, thermal energy is imparted to an EEPROM array through the conversion of electrical current in resistive elements within the EEPROM device to thermal energy by means of conduction through the semiconductor substrate. Although this represents an efficient means of elevating the temperature of an EEPROM array, the present invention contemplates other methods for elevating the temperature of an EEPROM array during a programming and erasing operation.

Figure 3:
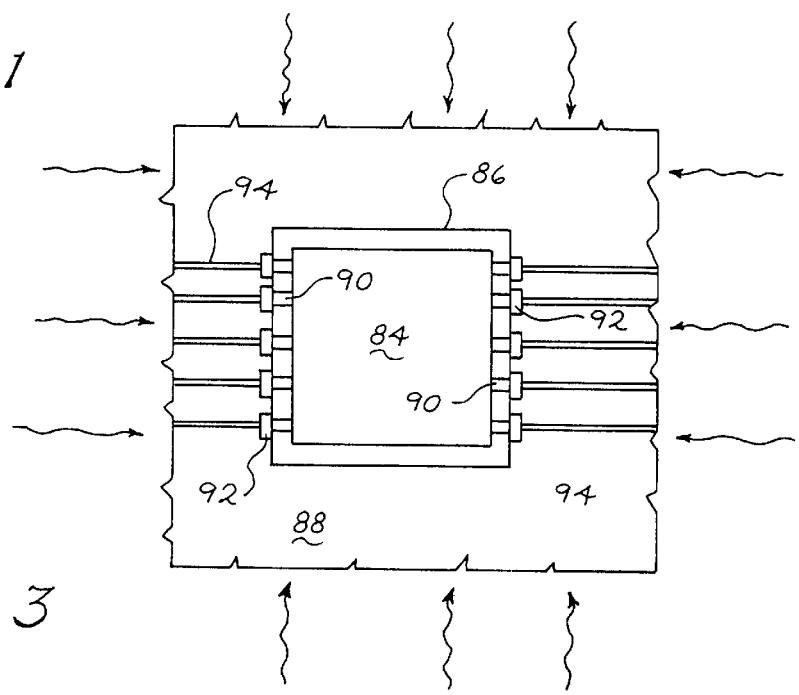
FIG. 3 is a top view of a programming board useful for programming a packaged semiconductor device having an EEPROM array in accordance with the invention.

Shown in FIG. 3, is a top view, of a packaged semiconductor device 84 having an EEPROM array therein. Packaged memory device 84 is inserted into a programming slot 86 located on a programming board 88. Individual package leads 90 electrically couple with electrical contacts 92 located at the edges of programming slot 86. Electrical potentials are applied to the EEPROM array within packaged semiconductor device 84 through electrical leads 94 located on programming board 88. Electrical leads 94 convey electrical potential to packaged semiconductor device 84 through electrical contacts 92 and packaged leads 90. Voltage sources (not shown) produce voltages in electrical leads 94 sufficient to program and erase data in the EEPROM array within packaged semiconductor device 84. Those skilled in the art will appreciate that, depending upon the particular nature of the programming being carried out, the EEPROM array can be erased prior to programming.

During any erasing and subsequent programming operation, thermal energy is generated in proximity to package semiconductor device 84 sufficient to elevate the temperature of packaged semiconductor device 84 above ambient room temperature. In one embodiment, thermal energy is provided that is sufficient to raise the temperature of the EEPROM array within packaged semiconductor device 84 to a temperature of at least about 70° C.

It is contemplated by the present invention that a number of different heat generating means can be used to raise the temperature of packaged semiconductor device 84. For example, radiative heat lamps can be arranged in the vicinity of programming board 88 and radiatively transferred heat to packaged semiconductor device 84. Alternatively, a convected heating apparatus can be used to raise the temperature of the ambient air surrounding the packaged semiconductor device 84, and transport the heated air past the surface of packaged semiconductor device 84. Although only a portion of a programming board is illustrated in FIG. 3, those skilled in the art will appreciate that many packaged semiconductor devices can be programmed simultaneously on a programming board containing multiple slots. Accordingly, the present invention contemplates the programming and erasing of numerous packaged semiconductor devices, while elevating the temperature of the devices during the programming and erasing operations.

Figure 4:
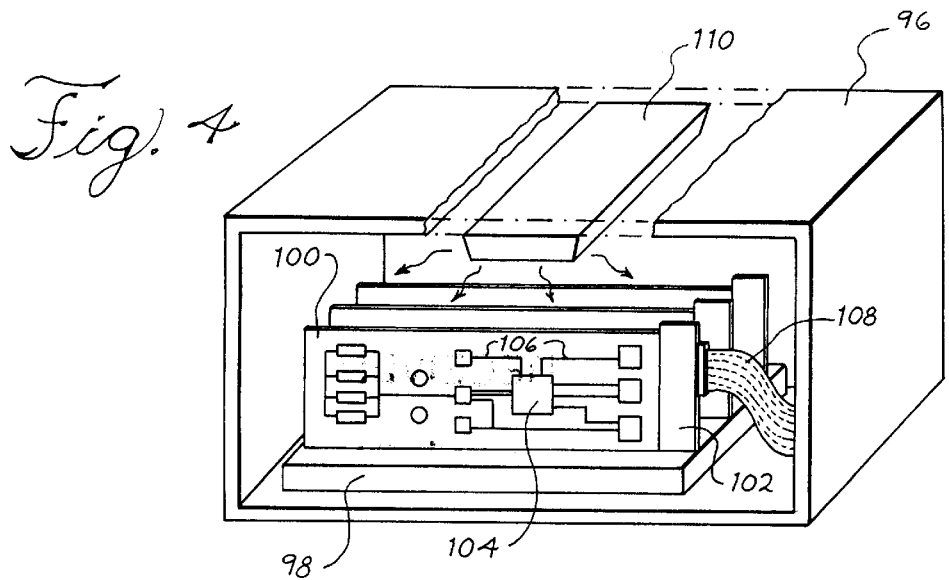
FIG. 4 is a perspective view of an electronic apparatus useful for programming a packaged semiconductor device having an EEPROM array in accordance with the invention.

Yet another embodiment of the invention is illustrated in FIG. 4. An electronic apparatus 96 is shown in a cutaway partial perspective view. Electronic apparatus 96 can be one of a number of different types of electronic apparatus', such as a desk-top computer, an engineering workstation, a signal processing section of a larger electronic system, and the like. Within electronic apparatus 96 are a number of printed circuit boards. Each printed circuit board is mounted on a rack 98 within electronic apparatus 96. One such printed circuit board 100 is mounted to rack 98 and electrically coupled to a connector 102. Mounted to printed circuit board 100 are a number of various electronic devices interconnected through metal leads located on printed circuit board 100.

A packaged semiconductor device 104 containing an EEPROM array is located on printed circuit board 100. External leads 106 are electrically coupled to packaged semiconductor device 104 and transfer electrical signals to and from the device. The EEPROM array within packaged semiconductor device 104 can be programmed and erased by control signals generated within electronic apparatus 96. The signals can be transmitted through a cable 108 electrically coupled to connector 102, which, in turn, is electrically coupled to printed circuit board 100 and to packaged semiconductor device 104 through external leads 106.

During erasing and programming, thermal energy is generated by a heat source 110 located within electronic apparatus 96. Heat source 110 can be a lamp, a heater and fan combination, a radiative block, and the like. Additionally, heat source 110 can be various auxiliary devices within electronic apparatus 96 that generate heat during operation. For example, electronic components, such as power supplies, power transistors, and the like, generate considerable heat during operation.

In many electronic apparatus', the thermal energy generated by internal components is controlled by cooling means to maintain air temperature within the apparatus within a controlled range. Because of the utilization of internal temperature regulation, many electronic apparatus have the ability to adjust internal temperatures to predetermine levels. Accordingly, another aspect of the present invention includes elevating the temperature of packaged semiconductor device 104 to at least about 70° C., while programming and erasing the EEPROM array within packaged semiconductor device 104. The internal programming and erasing of an EEPROM array within an electronic apparatus expands the utility of EEPROM devices, because these devices can be programmed and reprogrammed without removing them from the electronic apparatus. The present invention advantageously utilizes the on-line programming and erasing capability of many electronic apparatus to realize the long term EEPROM reliability improvement obtained through programming and erasing the EEPROM array at elevated temperatures.

Thus it is apparent there has been provided, in accordance with the invention, an EEPROM device and operating method that fully meet the advantages set forth above. Although particular embodiments of the invention have been described in the foregoing description, it will be apparent to one skilled in the art that numerous modifications and variations can be made to the illustrated embodiments, which still fall within the spirit and scope of the invention. For example, memory array layouts can be used that differ substantially from that illustrated in FIG. 2. Additionally, other types of EEPROM devices, such as those that store charge in dielectric layers rather than a floating-gate electrode can also be used. It is therefore intended to include within the invention all such variations and modifications has fall within the scope of the appended claims and equivalents thereof.

We claim:

1. A semiconductor device having an EEPROM array comprising:

a plurality of EEPROM cells, each cell including a write transistor, a read transistor, and a sense transistor; and means for heating the plurality of EEPROM cells, wherein the means for heating is located in close proximity to each of the plurality of EEPROM cells, so as to increase the temperature of each of the plurality of EEPROM cells during a programming and erasing operation.

2. The device of claim 1, wherein the means for heating comprises at least one thermal source in proximity to each of the plurality of EEPROM cells.

3. The device of claim 1, wherein the means for heating comprises a plurality of resistive elements in a peripheral region adjacent to each of the plurality of EEPROM cells.

4. The device of claim 1, wherein the means for heating comprises a plurality of polycrystalline silicon resistors.

5. The device of claim 1, wherein the means for heating comprises a plurality of doped regions in a semiconductor substrate.

6. The device of claim 1, wherein each of the plurality of EEPROM cells comprises a single polycrystalline EEPROM cell.

7. A method for operating a semiconductor device comprising the steps of:

providing a packaged semiconductor device having an EEPROM array and having electrical input and output connections;

electrically coupling external leads to the input and output connections;

elevating the temperature of the packaged semiconductor device; and applying voltage potentials to the leads sufficient to program and erase the EEPROM array.

8. The method of claim 7, wherein the step of elevating the temperature of the packaged semiconductor device comprises the step of thermally heating the EEPROM array to a temperature above an ambient temperature.

9. The method of claim 8, wherein the step of thermally heating the EEPROM array comprises thermal heating to a temperature of at least 70° C.

10. The method of claim 8, wherein the step of thermally heating the EEPROM array comprises thermal heating by means of convection.

11. The method of claim 8, wherein the step of thermally heating the EEPROM array comprises thermal heating by means of radiation.

12. The method of claim 7, wherein the step of providing a packaged semiconductor device having an EEPROM array comprises providing a semiconductor substrate having a plurality of EEPROM cells, and wherein each cell includes a plurality of resistive elements.

13. The method of claim 12, wherein the step of elevating the temperature of the EEPROM memory array comprises applying electrical current to the plurality of resistive elements sufficient to raise the temperature of the semiconductor substrate above an ambient temperature.

14. The method of claim 12, wherein the step of providing a semiconductor substrate comprises providing the plurality of resistive elements in a peripheral region adjacent to each of the plurality of EEPROM cells.

15. The method of claim 12, wherein the step of providing a plurality of resistive elements comprises providing a plurality of polycrystalline silicon resistors.

16. The method of claim 12, wherein the step of providing a plurality of resistive elements comprises providing a plurality of doped regions in the semiconductor substrate.

17. A method for operating a semiconductor device comprising the steps of:

providing an electronic apparatus having at least one printed circuit board therein, wherein a packaged semiconductor device having an EEPROM array is electrically attached to the printed circuit board;

elevating the temperature of the packaged semiconductor device to at least 70° C.; and applying electric potential to the packaged semiconductor device sufficient to erase and program the EEPROM array.

18. The method of claim 17, wherein elevating the temperature comprises applying convective heating from a heat source within the electronic apparatus.

19. The method of claim 17, wherein elevating the temperature comprises applying radiative heating from a heat source within the electronic apparatus.

20. The method of claim 17, wherein elevating the temperature comprises applying heat by controlling the ambient temperature within the electronic apparatus to a temperature of at least 70° C.

* * * * *